US008347696B2

(12) United States Patent
Espinosa et al.

(10) Patent No.: US 8,347,696 B2
(45) Date of Patent: Jan. 8, 2013

(54) MICROCHANNEL FORMING METHOD AND NANOTIPPED DISPENSING DEVICE HAVING A MICROCHANNEL

(75) Inventors: Horacio D. Espinosa, Winnetka, IL (US); Nicolaie A. Moldovan, Glenview, IL (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 12/803,664

(22) Filed: Jul. 1, 2010

(65) Prior Publication Data

US 2011/0036809 A1 Feb. 17, 2011

Related U.S. Application Data

(60) Division of application No. 11/516,039, filed on Sep. 5, 2006, now Pat. No. 7,775,087, which is a continuation-in-part of application No. 10/801,928, filed on Mar. 16, 2004, now Pat. No. 7,250,139.

(51) Int. Cl.
*B01L 3/02* (2006.01)
*G01Q 60/54* (2010.01)

(52) U.S. Cl. .................... 73/105; 216/2; 850/40
(58) Field of Classification Search .......... 73/105; 216/2; 436/180; 850/40
See application file for complete search history.

(56) References Cited

U.S. PATENT DOCUMENTS

| 7,034,854 | B2 | 4/2006 | Cruchon-Dupeyrat et al. ................. 346/140.1 |
| 7,241,420 | B2* | 7/2007 | Hantschel et al. ............ 422/502 |
| 7,250,139 | B2 | 7/2007 | Espinosa et al. ............ 422/100 |
| 7,281,419 | B2* | 10/2007 | Wang et al. ................ 73/105 |
| 7,690,325 | B2* | 4/2010 | Henderson et al. .......... 118/300 |
| 2004/0022681 | A1 | 2/2004 | Hantschel et al. .......... 422/63 |
| 2005/0079711 | A1 | 4/2005 | Busta ....................... 438/689 |
| 2005/0236566 | A1 | 10/2005 | Liu .......................... 250/306 |
| 2006/0057031 | A1 | 3/2006 | Hantschel et al. .......... 422/100 |

FOREIGN PATENT DOCUMENTS

WO    WO 00/42233    7/2000

OTHER PUBLICATIONS

R. Piner et al., "'Dip-Pen' Nanolithography," Science 283, pp. 661-663, 1999.

(Continued)

*Primary Examiner* — Daniel Larkin

(57) ABSTRACT

A method of forming a microchannel as well as a thin film structure including same is made by forming a first thin film on a side of a substrate, forming a fugitive second thin film on the first thin film such that the second thin film defines a precursor of the elongated microchannel and a plurality of extensions connected to and extending transversely relative to the precursor along a length thereof A third thin film is formed on the first thin film and the fugitive second thin film such that the second thin film resides between the first thin film and the third thin film. A respective access site is formed in a region of the third thin film residing on a respective extension and penetrating to the fugitive second thin film. The fugitive second thin film forming the precursor is selectively removed from between the first thin film and the third thin film using an etching medium introduced through the access sites, thereby forming the microchannel between the first thin film and the third thin film. The method preferably further includes forming a sealing layer on the third thin film in a manner to close off open access sites remaining after selective removal of the second thin film.

14 Claims, 11 Drawing Sheets

OTHER PUBLICATIONS

K. Lieberman, A. Lewis, G. Fish, S. Shalom, T.M. Jovin, A. Schaper, S.R. Cohen, "Multifunctional, micropipette based force cantilevers for scanned probe microscopy," Appl. Phys. Lett., 64(5), pp. 648-650, 1994.

E. Hong, S.V. Krishnaswamy, C. B. Freidhoff, S. Trolier-McKinstry, Fabrication of Piezoelectric Diaphragm using Lead Zirconate Titanate (PZT) Films, Mat. Res. Soc. Symp. Proc. vol. 687, 2002 B5.16.1.

A. Lewis, Y. Kheifetz, E. Shambrodt, A. Radko, E. Khatchatryan, C. Sukenik, "Fountain pen nanochemistry: Atomic force control of chrome etching," Appl. Phys. Lett., 75(17), pp. 2689-2691, 1999.

I.W. Rangelow, J. Voigt, K. Edinger, "Nanojet: Tool for the nanofabrication," J. Vac. Sci. Technol. B, 19(6), pp. 2723-2726, 2001.

S. Shalom, K. Lieberman, A. Lewis, "A micropipette force probe suitable for near-field scanning optical microscopy," Rev. Sci. Instrum., 63(9), pp. 4061-4065, 1992.

M.J. de Boer, R.W. Tjerkstra, J.W. Berenschot, H.V. Jansen, G.J. Burger, J.G.E. Gardeniers, M. Elwenspoek, A. van den Berg, "Micromachining of buried microchannels in silicon," J. Microelectromech. Sys.,9(1), pp. 94-103, 2000.

M.-H. Hong, K.H. Kim, J. Bae, W.Jhe, "Scanning nanolithography using a material-filled nanopipette," Appl. Phys. Lett. 77(16), pp. 2604-2606, 2000.

I. Papautsky, J. Brazzle, H. Swerdlow, R. Weiss, A.B. Frazier, "Micromachined pipette arrays," IEEE Trans Biomedical Engineering, 47(6), pp. 812-819, 2000.

S. Hong, et al., "A Nanoplotter with Both Parallel and Serial Writing Capabilities," Science 288, pp. 1808-1811, 2000.

S. Minne, et al., "Automated Parallel High-Speed Atomic Force Microscopy," Appl. Phys. Lett. 72(18), pp. 2340-2342, 1998.

S. Minne, et al., "Centimeter Scale Atomic Force Microscope Imaging and Lithography," Appl. Phys. Lett. 73(12) pp. 1742-1744, 1998.

P. Vettiger, et al., "The 'Millipede'—More than one thousand tips for future AFM data storage," IBM J. Res. Develop. 44(3), pp. 323-340, 2000.

P. Vettiger, et al., "The 'Millipede'—Nanotechnology Entering Data Storage," IEEE Trans. on Nanotech. 1(1), pp. 39-55, 2002.

M. Zhang, et al., "A MEMS nanoplotter with high-density parallel dip-pen nanolithography probe arrays," Nanotechonlogy 13, pp. 212-217, 2002.

J. Zou, et al., "Conductivity-based contact sensing for probe arrays in dip-pen nanolithography," Appl. Phys. Lett. 83(3), pp. 581-583, 2003.

* cited by examiner

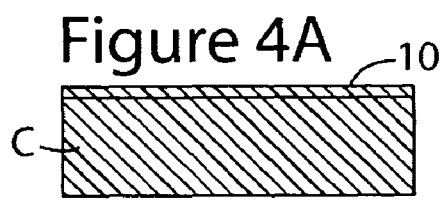
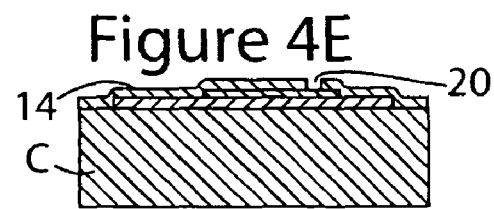
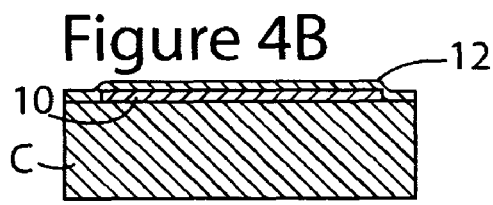
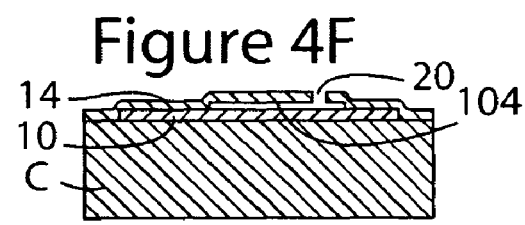
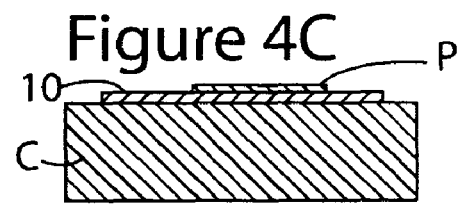
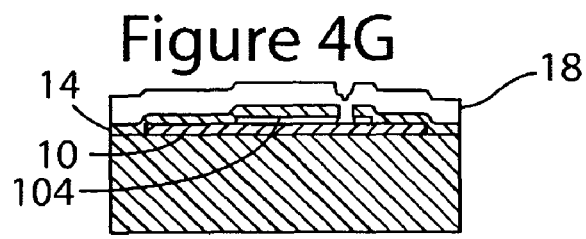
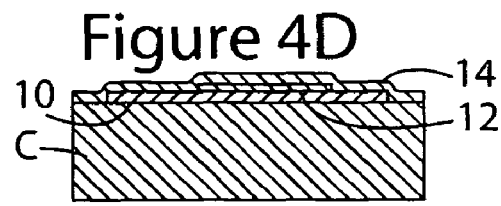
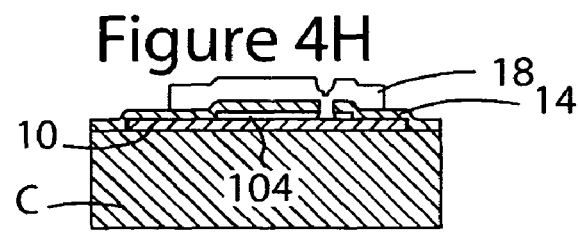

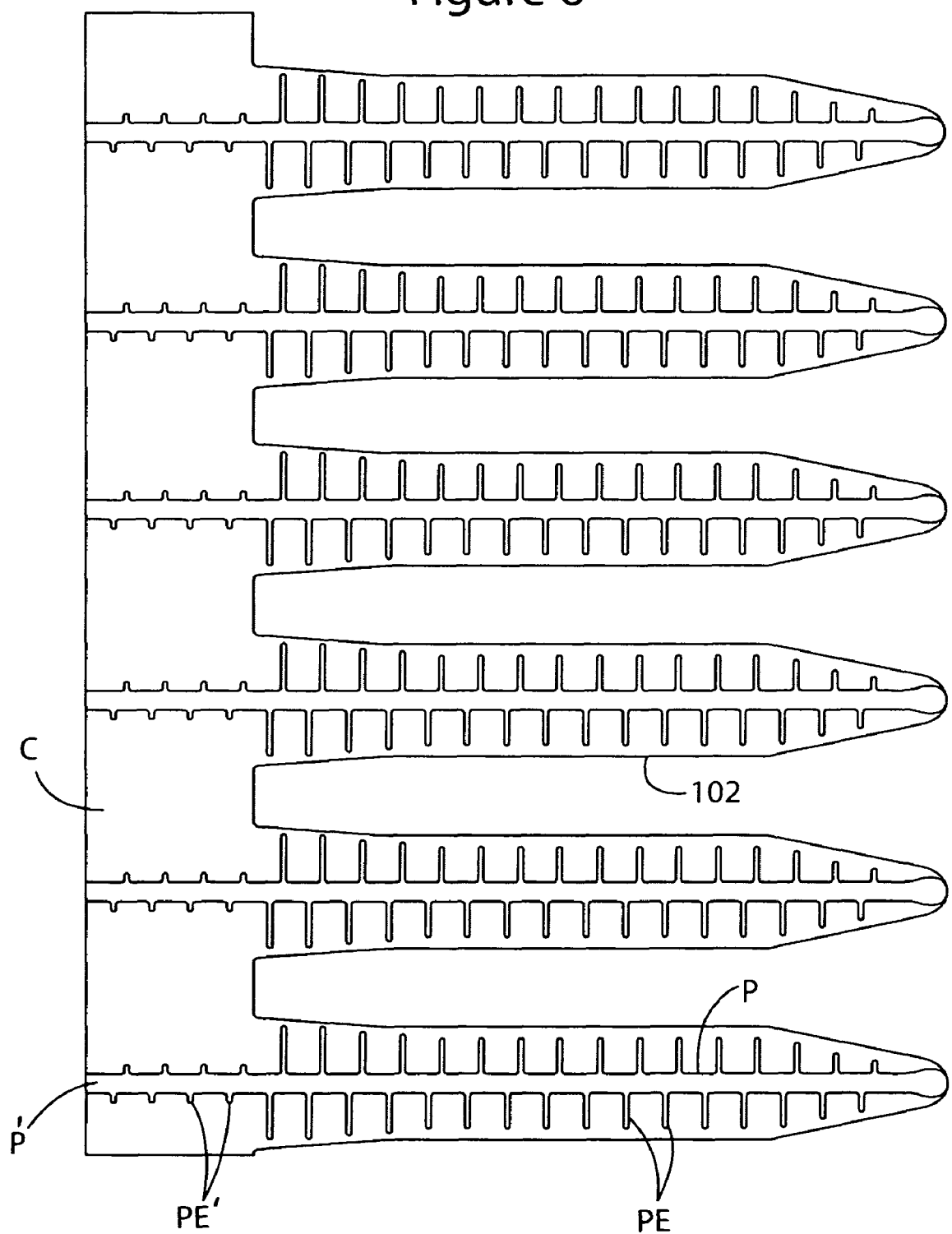

MICROCHANNEL FORMING METHOD AND NANOTIPPED DISPENSING DEVICE HAVING A MICROCHANNEL

This application is a division of U.S. application Ser. No. 11/516,039 filed Sep. 5, 2006, now U.S. Pat. No. 7,775,087, which is a continuation-in-part of U.S. application Ser. No. 10/801,928 filed Mar. 16, 2004, now U.S. Pat. No. 7,250,139.

CONTRACTUAL ORIGIN OF THE INVENTION

This invention was made with government support under Grant No. EEC-0118025 and CMS-0120866 awarded by National Science-Foundation. The Government has certain rights in the invention.

FIELD OF THE INVENTION

The present invention relates to a method of forming an elongated microchannel as well as to a thin film structure and microcantilever having a microchannel for use in a dispensing device wherein fluid material is supplied via the microchannel to the microtip.

BACKGROUND OF THE INVENTION

Dip-pen nanolithography (DPN) has been developed to dispense material by molecular transport from a cantilever tip mounted on the probe of an atomic force microscope (AFM) onto a substrate surface as described in Science 283, 661 (1999). DPN is disadvantageous in that repeated re-inking of the dispensing tip is required to replenish molecules when large surface areas are to be patterned or when complex patterns are required. DPN also suffers from low speed and throughput due to its serial nature and limited scan size.

Another technique for nanopatterning involves a micropipette used as an AFM probe as described in Appl/Phys. Lett. 65 (5), 648 (1994). The micropipette technique suffers from the disadvantage of irregular shape of the micropipette, low reproducibility, and low resolution. The micropipette is difficult to integrate in array format to carry out massive patterning operations on one or more substrates.

Still another technique referred to as millipede:parallel read/write is described in IEEE Trans. on Nanotech. 1 (1), 39 (2002) and involves a cantilevered AFM probe having a heated tip able to write on a thermoplastic substrate by embossing the tip into the thermoplastic material. The technique does not dispense any material, but is illustrative for a massively parallel writing method using AFM probe arrays.

Copending U.S. application Ser. No. 10/801,928 filed Mar. 16, 2004, now U.S. Pat. No. 7,250,139, describes a method of making a cantilever having a microchannel communicating with a microtip in a manner that requires edge sealing of the microchannel along its length.

The present invention provides a thin film structure and method of forming a microchannel in a manner that does not require edge sealing along its length, improves sealing capability, simplifies processing steps, and provides other advantages.

SUMMARY OF THE INVENTION

The present invention provides a method of forming a microchannel comprising the steps of forming a first thin film on a side of a substrate, forming a fugitive second thin film on the first thin film such that the second thin film defines a precursor of the elongated microchannel and a plurality of extensions connected to and extending transversely relative to the precursor along a length thereof. A third thin film is formed on the first thin film and the fugitive second thin film such that the second thin film resides between the first thin film and the third thin film. A respective access site is formed in a region of the third thin film residing on a respective extension and penetrating to the fugitive second thin film. The fugitive second thin film forming the precursor is selectively removed from between the first thin film and the third thin film using an etching medium introduced through the access sites, thereby forming the microchannel between the first thin film and the third thin film. The method preferably further includes forming a sealing layer on the third thin film in a manner to close off open access sites remaining after selective removal of the second thin film.

In an illustrative embodiment of the invention, the method also includes forming the first thin film, second thin film, and third thin film on a pointed microtip of the substrate, providing an access site in the third thin film at the microtip and selectively removing the fugitive second layer at the tip using an etching medium introduced through the access site to form an annular microchannel disposed between the first thin film and the third thin film at the microtip and communicated to the channel void. The first thin film may comprise silicon nitride, diamond, silicon carbide or other suitable material.

In another illustrative embodiment of the invention, the method includes leaving some of the fugitive second thin film at the extensions after selective removal of the precursor.

In still another illustrative embodiment of the invention, the first film is formed to define an elongated cantilever of a dispensing device such that the microchannel extends along a length of the cantilever. The method preferably further includes forming a reservoir on an opposite side of the substrate from the first thin film wherein the reservoir communicates via the microchannel with the microtip to dispense material from the reservoir to the microtip where the material is dispensed onto a surface.

In still another illustrative embodiment of the invention, the method further includes forming a piezoelectric actuator layer on the cantilever. Preferably, the actuator layer is formed on the sealing layer that seals the access site(s). For example, the actuator layer is formed on the sealing layer and then the actuator layer and sealing layer are patterned to overlie the cantilever.

The present invention envisions a thin film structure comprising a first thin film and second thin film forming a microchannel therebetween. The microchannel includes a plurality of microchannel extensions that extend transversely therefrom along its length, one or both of the first thin film or second thin film having a respective access site to a respective extension of the microchannel to provide access thereto. A sealing material is provided to close off the access sites. The sealing material preferably comprises a sealing layer on one of the first thin film or second thin film. The extensions of the microchannel of the thin film structure can contain material of a thin film formerly residing between the first thin film and the second thin film at the microchannel.

The present invention further envisions a microcantilever comprising a pair of thin films and having a microchannel along its length formed between the thin films, the microchannel having a plurality of microchannel extensions that extend transversely therefrom along its length, and respective access sites in one of the thin films providing access to respective extensions of the microchannel, and a sealing material closing off the access sites. The microcantilever further includes a microtip for dispensing material.

In an illustrative embodiment of the invention, the microtip preferably includes an annular microchannel formed about a pointed tip. The pointed tip is formed by one of a pair of thin films and the annular microchannel is formed between the pair of thin films about the pointed tip. The pointed tip can comprise silicon nitride, diamond, silicon carbide or other hard material.

In another illustrative embodiment of the invention, the microcantilever can be formed to extend from a semiconductor chip substrate.

In still another illustrative embodiment of the invention, the microcantilever can include a piezoelectric actuator layer on one of the first thin film or second thin film to enable control of the cantilever microtip position and motion during material dispensing, such as during writing or probing.

In a further illustrative embodiment of the invention, the microcantilever preferably further includes a reservoir on an opposite side of the cantilever from the microtip. One of the thin films includes one or more openings at such a location that the one or more openings communicate to the reservoir.

Other advantages of the present invention will become more readily apparent from the following detailed description taken with the following drawings.

DESCRIPTION OF THE DRAWINGS

In FIG. 3C, the third (top) film is shown as transparent to reveal the second film therebelow.

FIGS. 4A through 4B are transverse sectional views of the first, second, and third thin films deposited to form the cantilever on the chip substrate with FIG. 4B being a transverse sectional view through FIG. 3A, FIG. 4C being a transverse sectional view through FIG. 3B, and FIG. 4E being a transverse sectional view through FIG. 3C.

FIG. 6 is an optical micrograph at 200× showing cantilevers with microchannel precursors thereof connected to microchannel precursors on the chip substrate.

DESCRIPTION OF THE INVENTION

Figure 1:
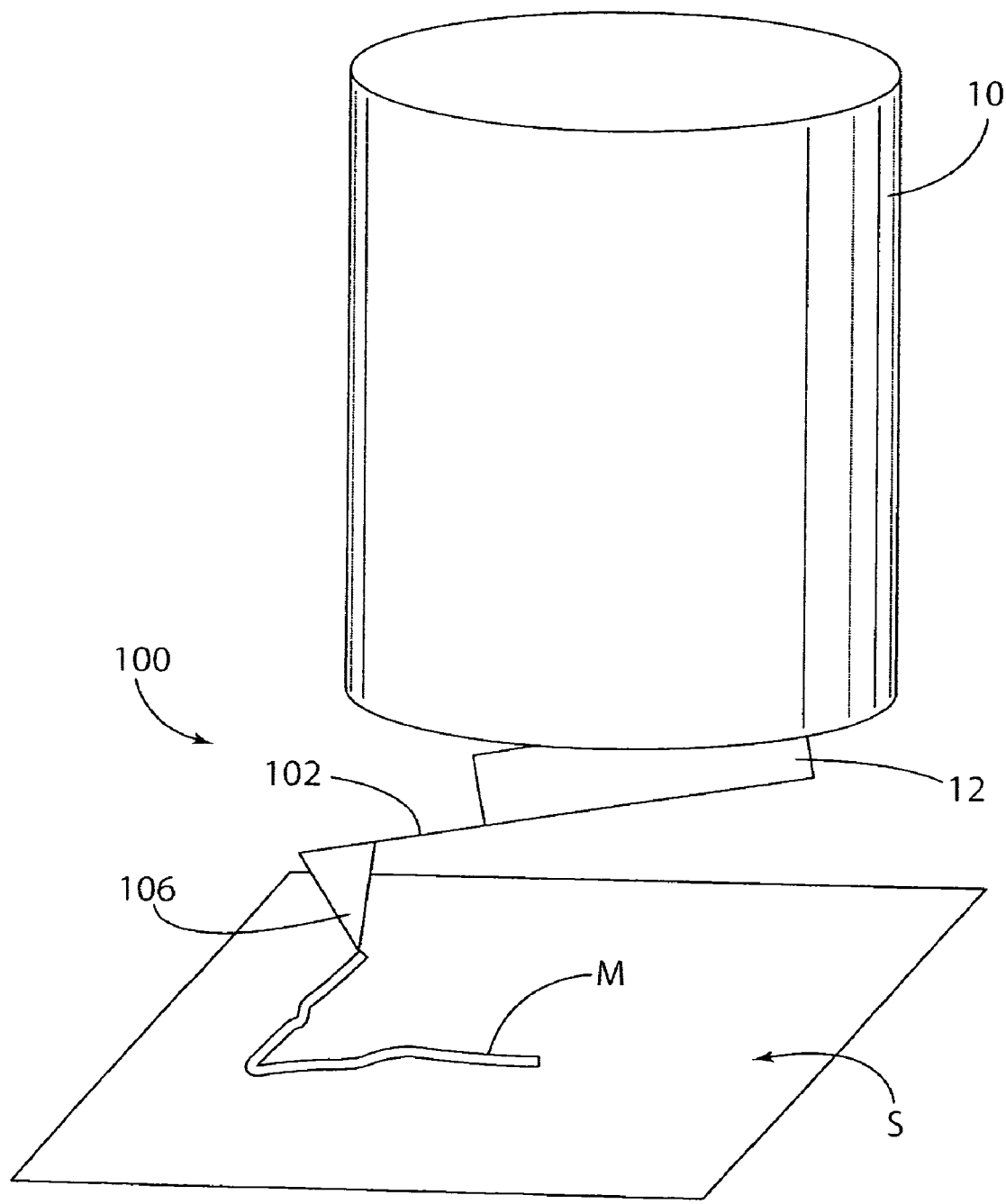
FIG. 1 is a schematic view of an atomic force microscope (AFM) head having a holder on which an illustrative writing material dispensing device shown schematically mounted thereon for writing on a surface.

Referring to FIG. 1, an atomic force microscope (AFM) scanning head 10 having a tip carrier 12 is illustrated schematically for purposes of illustration and not limitation. A dispensing device 100 having a cantilever 102 with a microtip 106 pursuant to an illustrative embodiment of the invention is schematically shown disposed or mounted on the tip carrier 12 for movement (e.g. raster scanning) with the scanning head 10 to dispense writing material M on a surface S. More particularly, a silicon semiconductor chip having the dispensing device 100 fabricated thereon is mounted on the tip carrier 12 in the same manner as a conventional AFM probe tip such that the AFM hardware and software can be used to move the dispensing device to write a pattern with nanometer resolution of pattern features on surface S.

Figure 2:
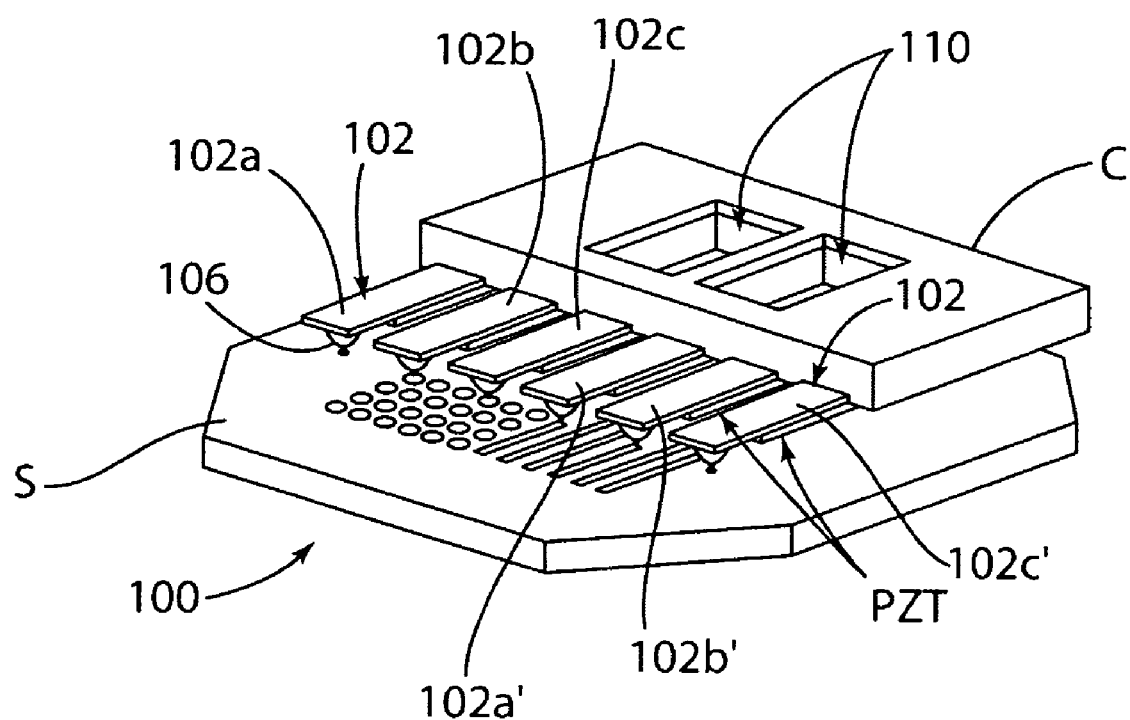
FIG. 2 is a schematic perspective view of a dispensing device pursuant to an illustrative embodiment of the invention for dispensing material onto a surface.

Referring to FIG. 2, a dispensing device 100 pursuant to an illustrative embodiment of the invention is shown for purposes of illustration and not limitation. The present invention can be practiced to form a microchannel in a thin film structure for any use or purpose and is not limited to a microchannel for a dispensing device.

Referring to FIG. 2, the dispensing device 100 is shown schematically as comprising a semiconductor chip substrate C on which the dispensing device is fabricated by micromachining techniques as described below. The dispensing device 100 comprises one or more elongated cantilevers 102 (six cantilevers shown) that each comprise a plurality of thin films arranged relative to one another as described below to define an elongated cantilever body having a microchannel 104, FIG. 4H, therein and to define a material-dispensing working microtip 106 proximate an end of each cantilever remote from the chip substrate C. Each microtip 106 is communicated to a respective microchannel 104 to receive material M therefrom to be dispensed from the microtip onto the surface S.

In turn, the microchannels of cantilevers 102a, 102b, 102c are communicated to a material-containing reservoir 110 that supplies material M to the microchannels. The microchannels of cantilevers 102a', 102b', 102c' are communicated to a different common material-containing reservoir 110 that supplies the same or different material M to the microchannels. Each microchannel may be communicated to its own respective material-containing reservoir, however.

The microcantilevers 102 each can include a piezoelectric actuator layer PZT and its two electrical contact layers (not shown in FIG. 2) to enable control of the cantilever microtip position and motion during material dispensing, such as during writing or probing. For example, the PZT layer is used with a platinum or other electrode (50-100 nm thick) underneath it and a similar electrode on top of it to provide electrical contacts. A chromium or titanium adhesion layer (5-10 nm thick) is provided between the platinum electrode and the sealing layer to be described.

Figure 2A:
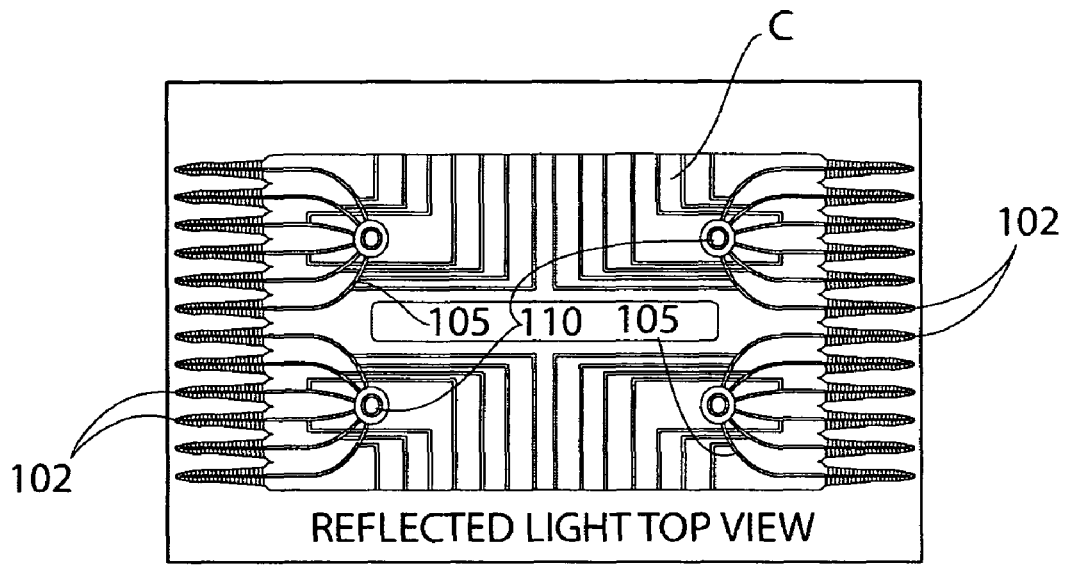
FIG. 2A is a reflected light, top side view photograph of a chip having twin arrays of 12 equal-length cantilevers and multiple reservoirs.
Figure 2B:
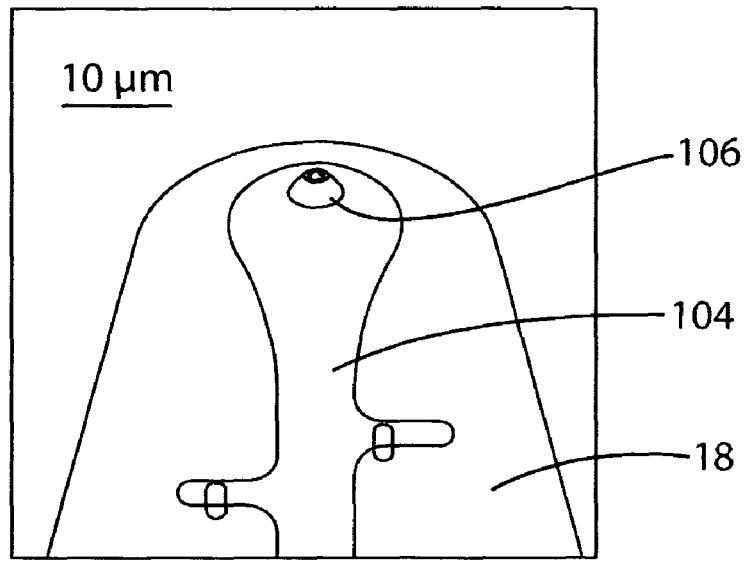
FIG. 2B is a scanning electron micrograph of one of the cantilevers showing the microtip at an end thereof and the sealing layer overlying the microchannel-forming thin films.
Figure 2C:
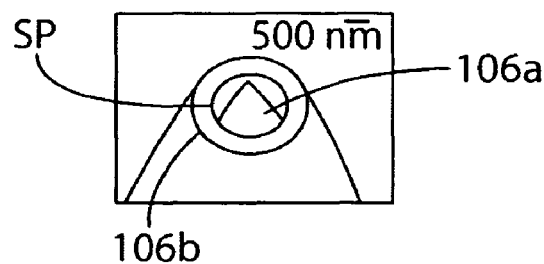
FIG. 2C is a scanning electron micrograph of the microtip.

FIGS. 2A and 2B illustrate an actual dispensing device fabricated on a silicon chip substrate wherein the device includes twin arrays of twelve equal-length cantilevers 102 on opposite sides of the chip substrate C and multiple fluid material reservoirs 110 connected by a respective microchannel 105 to a respective microchannel 104 of each cantilever 102. FIG. 2B illustrates one of the cantilevers showing the microchannel 104 communicated in fluid flow relation to an annular space about the microtip 106 and a sealing layer 18 described below overlying a portion of the cantilever. The microtip 106 is shown in greater detail in FIG. 2C to comprise pointed tip 106a formed by a first thin film to be described below and a surrounding shell 106b formed by a third thin film to be described below forming the fluid dispensing annular space SP about the pointed tip 106a. The fluid dispensing microtips 106 are formed in a manner described in copending Ser. No. 10/801,928 filed Mar. 16, 2004, U.S. Pat. No. 7,250, 139, the teachings of which are incorporated herein by reference.

Referring to FIGS. 3A, 3B, and 3C and FIGS. 4A through 4H, the formation of one of the cantilevers 102 on the chip (wafer) C is shown for a particular illustrative embodiment of the invention. However, this is offered for purposes of illustration and not limitation since all six (or particular number) of the cantilevers 102 will be formed simultaneously on the chip C using this methodology.

In FIG. 4A, a first thin film 10 is shown deposited on the silicon chip substrate C. For purposes of illustration and not limitation, the first thin film 10 can comprise silicon nitride ($Si_3N_4$) having a thickness of 0.350-0.500 microns and can be deposited by LPCVD (low pressure chemical vapor deposition) or PECVD (plasma enhanced chemical vapor deposition). Alternately, the first thin film 10 can comprises a form of diamond (e.g. nanocrystalline diamond) or silicon carbide to provide a hard film at the microtip 106 region of the cantilever.

Figure 3A:
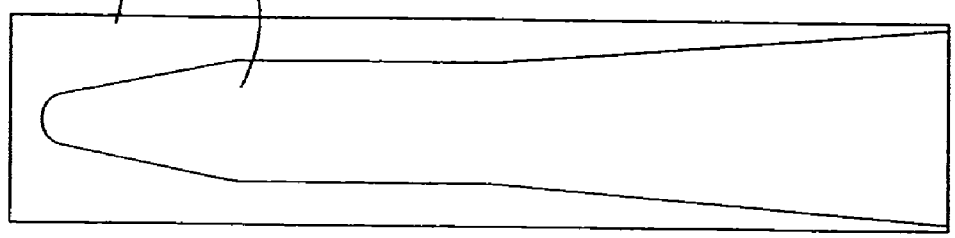
FIGS. 3A, 3B, and 3C are plan views of formation of first, second and third thin films to form a cantilever on a semiconductor chip substrate.

The first thin film 10 is patterned by conventional lithography to define a cantilever precursor shape shown in FIGS. 3A and 4B. The cantilever shape can have any suitable dimensions for an intended application. For example, cantilever lengths can be from 300 microns to 500 microns with a cantilever stiffness of 0.05 to 0.4 N/m for purposes of illustration and not limitation. The lithographic patterning can be conducted using a conventional photoresist layer and etching medium such as $CF_4$ reactive ion etching (RIE) for a silicon nitride thin film.

Figure 3B:
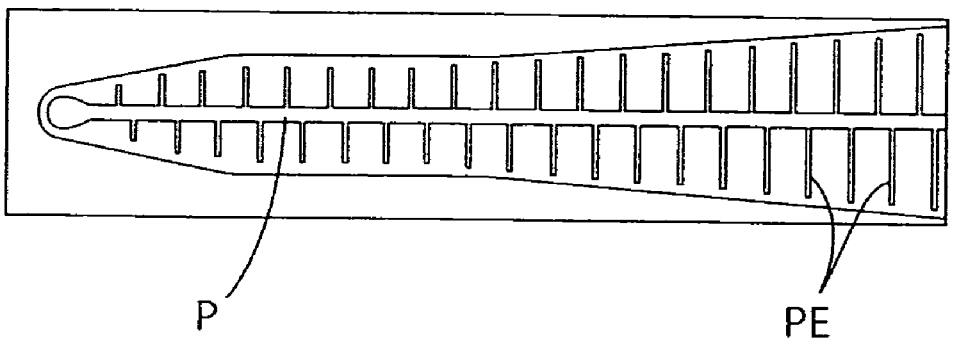

In FIG. 4B, a second thin film 12 is shown deposited on the cantilever-patterned first thin film 10. For purposes of illustration and not limitation, the second thin film 12 can comprise silicon dioxide ($SiO_2$) or boron-phosphorus silicon glass (BPSG) having a thickness of 0.3-0.6 microns and can be deposited by LPCVD or PECVD. The second thin film 12 is patterned by conventional lithographic techniques to define the precursor P of the elongated microchannel 104 and a plurality of microchannel precursor extensions or beams PE connected to and extending transversely relative to the precursor P along the length of the precursor as shown in FIG. 3B and FIG. 4C. The microchannel precursors P can have a width of 4 to 7 microns and height of 0.3 to 0.6 microns and the extensions or beams PE can have a width of 1 to 3 microns and various lengths for purposes of illustration and not limitation.

In FIG. 4D, a third thin film 14 is shown deposited on the first thin film 10 and second thin film 12 (precursor 12) on the chip substrate C. The third thin film 14 can comprise silicon nitride ($Si_3N_4$) having a thickness of 0.5-1 micron and can be deposited by LPCVD for purposes of illustration and not limitation.

In FIG. 4E, the third thin film 14 is patterned by conventional lithographic techniques to define the shape of the cantilever (or at least to cover the precursor P and extensions PE) and also to form holes, passages or other access sites 20 in a region of the third thin film 14 residing on a respective extension PE and penetrating to the fugitive second thin film 12. The access sites 20 provide entry or access of an etching medium in the next step to selectively remove the second thin film 12. The third thin film 14 is patterned by conventional lithography using a conventional photoresist layer and etching medium such as $CF_4$ reactive ion etching (RIE).

The access sites 20 can have any suitable shape, such as oval as shown, circular or any other shape, and dimensions to permit etching medium to penetrate to the second thin film 12. For purposes of illustration and not limitation, the oval access sites 20 shown can have a major dimension of 3-5 microns and a minor dimension of 2-3 microns.

Figure 3C:
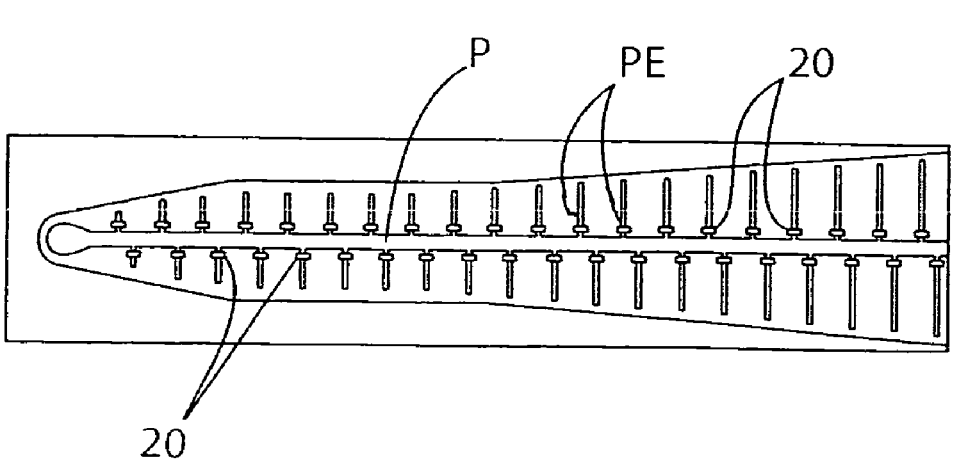

The extensions PE and access sites 20 are provided at locations and distances along the microchannel precursor P, FIG. 3C, in a manner to provide relatively uniform removal (etching) of the second thin film 12 along the length of the precursor P within desired etching times.

In FIG. 4F, the fugitive second thin film 12 forming the precursor P is selectively removed from between the first thin film 10 and the third thin film 14 using an etching medium introduced through the access sites 20, thereby forming the microchannel 104 between the first thin film 10 and the third thin film 14 as shown in FIG. 4F. Selective etching of the fugitive second thin film 12 is conducted by a buffered oxide etch (hydrofluoric acid+ammonium fluoride 1:10).

The microchannels in the cantilevers 102 can have any suitable dimensions such as a width of 4 to 7 microns and height of 0.3 to 0.6 microns for purposes of illustration and not limitation. The microchannel extensions 104e can have a width of 1 to 3 microns and various lengths transverse to the microchannel, the lengths typically being greater than 3 microns for purposes of illustration and not limitation.

Figure 5:
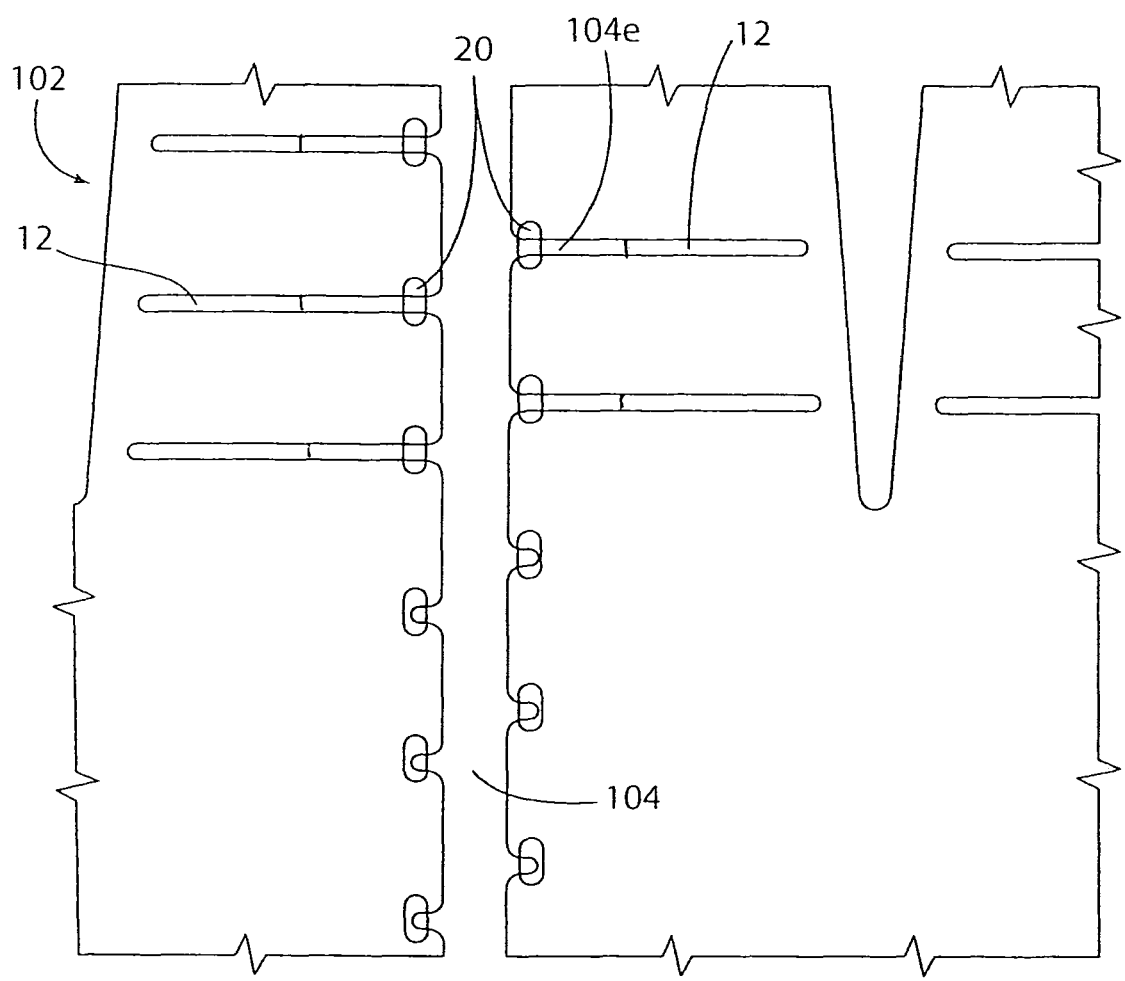
FIG. 5 is a optical micrograph at 533× of the microchannel and microchannel extensions after selective etching of the fugitive second thin film with some of the fugitive (sacrificial) second thin film remaining in the microchannel extensions.

FIG. 5 illustrates an actual microchannel 104 formed after selective removal of the fugitive second thin film 12 from between the first and third thin films 10, 14 by etching as described above. FIG. 5 reveals that some of the fugitive second thin film is still present in the extensions or beams PE after selective etching of the second thin film and can impart increased lateral bending and torsional stiffness to the cantilever 102.

In FIG. 4G, a sealing layer 18 is shown deposited on the third thin film 14 in a manner to seal the access sites 20 in the third thin film layer. The sealing layer 18 can comprise silicon dioxide ($SiO_2$) having a thickness of 1.9 microns and can be deposited by PECVD. Since only the access sites 20 at the microchannel extensions 104e need to be sealed, the probability of faulty sealing of the access sites is significantly reduced.

In FIG. 4H, the sealing layer 18 is patterned by conventional lithographic techniques to overlie the third thin film 14 at least wherever access sties 20 are present using a conventional photoresist layer and etching medium such as buffered oxide etch.

FIG. 2B illustrates the cantilever with the sealing layer 18 patterned so as to overlie and seal the access sites in the third thin film. The sealing layer 18 stops short of the microtip 106 at the end of the cantilever since it is not needed there.

Referring again to FIGS. 2A and 2B, a respective microchannel 104 communicates in fluid flow relation to a respective microchannel 105 formed on the chip substrate. In turn, each microchannel 105 is communicated to one of the material reservoirs 110 as shown in FIG. 2A. The microchannels 105 are formed in the same manner and at the same time as microchannels 104 by depositing and patterning the first, second, and third thin films 10, 12, 14 on the chip substrate C and then selectively removing (e.g. etching) the second thin film 12 from between the first and third thin films 10, 14. Referring to FIG. 6, the precursors P' (second thin film 12) for the microchannels 105 have extensions PE' similar to the precursors for extensions 104e of the microchannels 104 with similar access sites (not visible in FIG. 6) in the third thin film 14 to permit selective etching thereof when the microchannels 104 are etched. The microchannels 105 extend to and are in fluid flow relation with reservoirs 110, FIG. 2A.

An illustrative method pursuant to the invention for fabricating the microchannels 104, 105 and reservoirs 110 is illustrated in FIGS. 7A through 7I. The reservoir fabrication method permits the compact integration of multiple reservoirs 110 on the same chip substrate. Pursuant to the illustrative embodiment of the invention, each reservoir 110 is fabricated by DRIE (referred to and known as the Bosch process where DRIE is deep reactive ion etching) from the back side of the chip substrate (wafer).

Figure 7A:
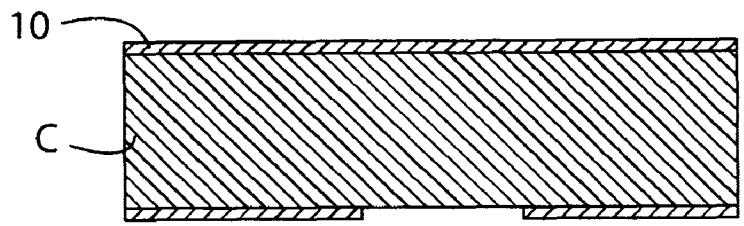
FIGS. 7A through 7I illustrate a microfabrication method according to an embodiment of the invention to make the reservoirs.

Referring to FIG. 7A, the silicon chip substrate (wafer) C is shown after deposition of the first thin film 10 on the top side in the figure and after patterning of the first thin film 10 on the back side in the figure. Each reservoir 110 is formed starting from the bottom of a respective trench T, see FIG. 7B.

Figure 2D:
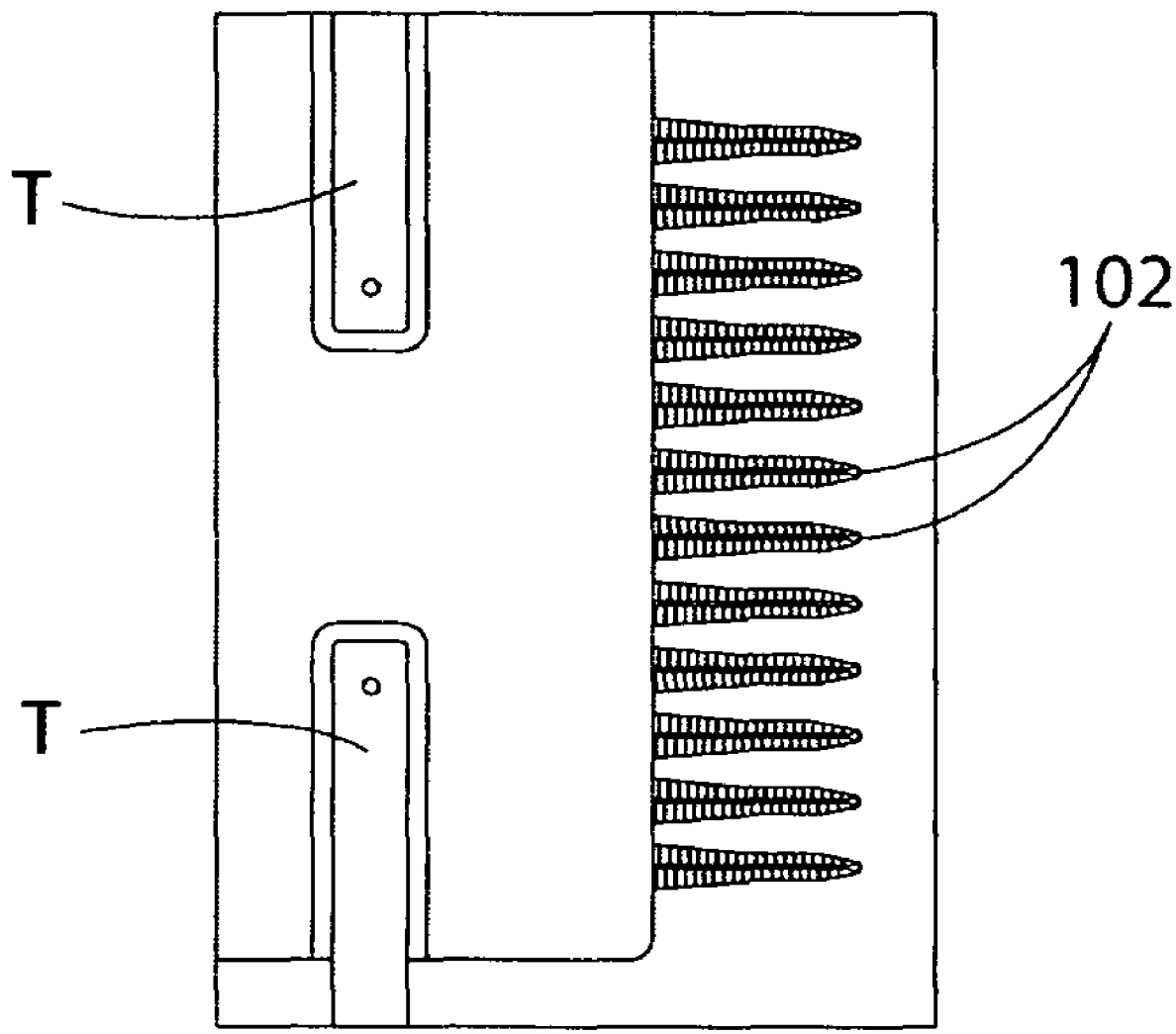
FIG. 2D is a reflected light, backside top view photograph of a chip having twin arrays of twelve equal-length cantilevers and multiple reservoirs.
Figure 7B:
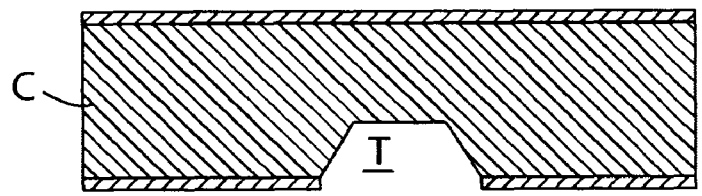

Referring to FIG. 7B, one of four trenches T of trapezoidal cross section is shown. The trenches are obtained by orientation dependant (KOH) etching of the backside. For example, the etching of the trenches is conducted by 40% KOH at 80° C. The trapezoidal trenches T are needed for inserting a feeding capillary tube (not shown) to provide fluid material from outside the chip to the reservoirs. Two trenches T are shown in FIG. 2D, the other two are similar and located adjacent the other side of the chip substrate.

Figure 7C:
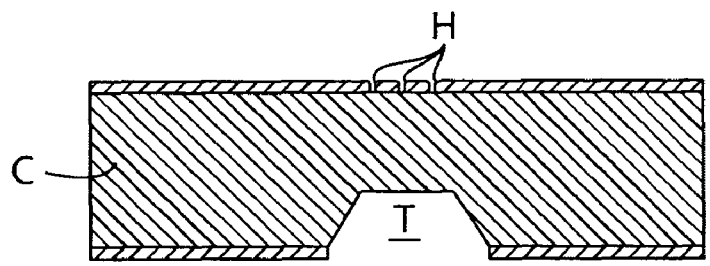

Referring to FIG. 7C, the first thin film 10 is patterned and etched as described above in connection with FIGS. 3 and 4. Holes H are etched in the region of the first thin film opposite from the reservoir as seen in FIG. 7C.

Figure 7D:
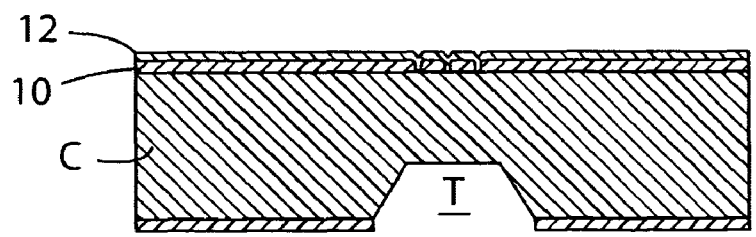

Referring to FIG. 7D, the second thin film 12 is shown deposited on the first thin film 10 by PECVD or LPCVD. The second thin film temporarily fills the holes H in the first thin film 10.

Figure 7E:
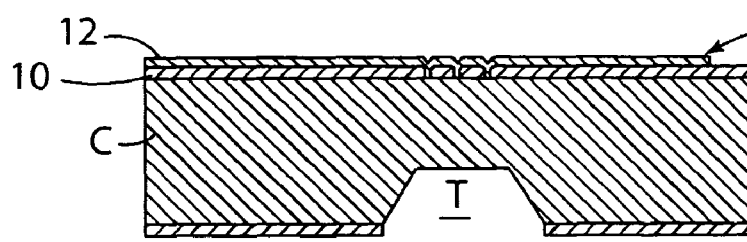

Referring to FIG. 7E, the second thin film 12 is patterned as described above in connection with FIGS. 3 and 4 to form the microchannel precursor P with extensions PE.

Figure 7F:
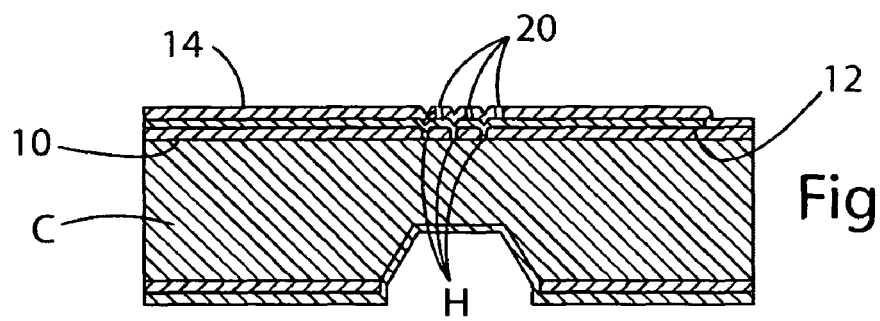

Referring to FIG. 7F, the third thin film 14 is deposited and patterned to delineate the cantilevers 102 as described above in connection with FIGS. 3 and 4. The access sites 20 are formed at this time. The access sites 20 in the third thin film 14 are formed in the region of the third film opposite from the reservoir but not overlapping the holes H in the first thin film 10 in this region as seen in FIG. 7F.

Figure 7G:
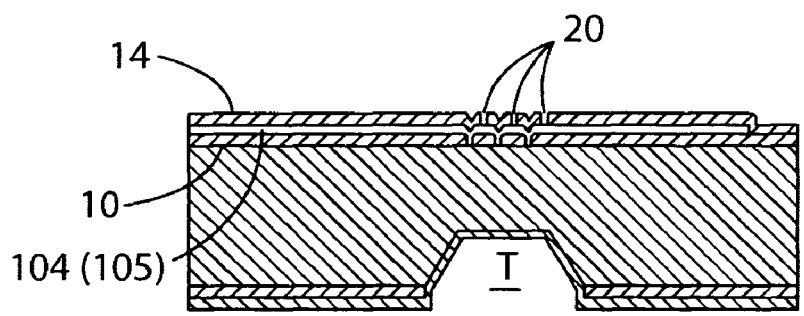

Referring to FIG. 7G, the fugitive second thin film 12 is selectively removed by etching as described above in connection with FIGS. 3 and 4 to form microchannels 104, 105.

Figure 7H:
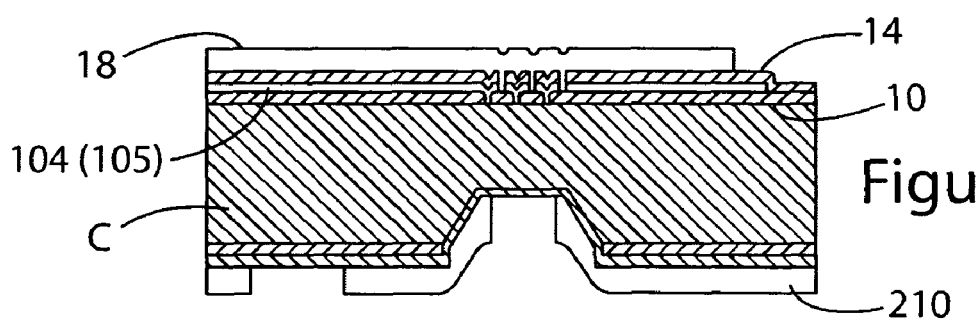

Referring to FIG. 7H, the sealing layer 18 is deposited to seal the access sites 20 of the third thin film 14 as described above in connection with FIGS. 3 and 4. Also, a thick resist layer 210 is patterned on the back side in a manner that will permit formation of the reservoirs, delineation of the chip body, and release of the cantilevers 102 from the chip substrate by backside etching.

Figure 7I:
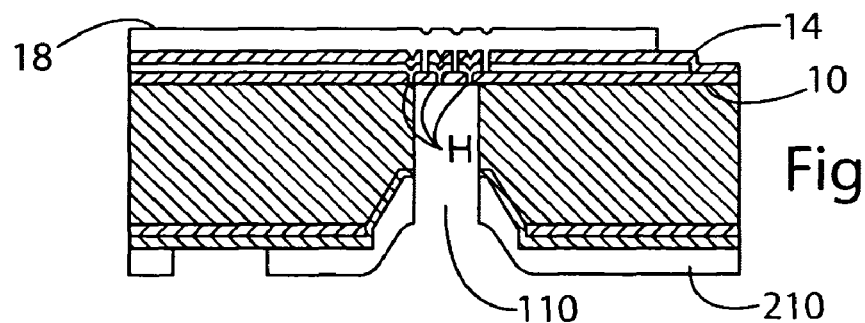

Referring to FIG. 7I, the thin films are removed from the back side of the chip substrate using RIE, and the chip substrate is etched through using DRIE (Bosch process) to form reservoirs 110 communicated in fluid flow relation to the microchannel 105 via holes H and in turn to the microchannels 104 of the cantilevers. This through-etch delineates the chip body and releases the cantilevers. An optional etch using $SF_6$ (RIE) or $XeF_2$ etch can complete the release if needed.

The integration of piezoactuator layer PZT on the cantilevers 102, for independent position control of the probes can be achieved by deposition of a Ti/Pt layer (e.g. a Ti adhesion layer and Pt electrode on the adhesion layer) as a lower electrode on each cantilever 102 and patterning it on top of the sealing layer 18, prior to its patterning, in order to protect the tip region.

Figure 8:
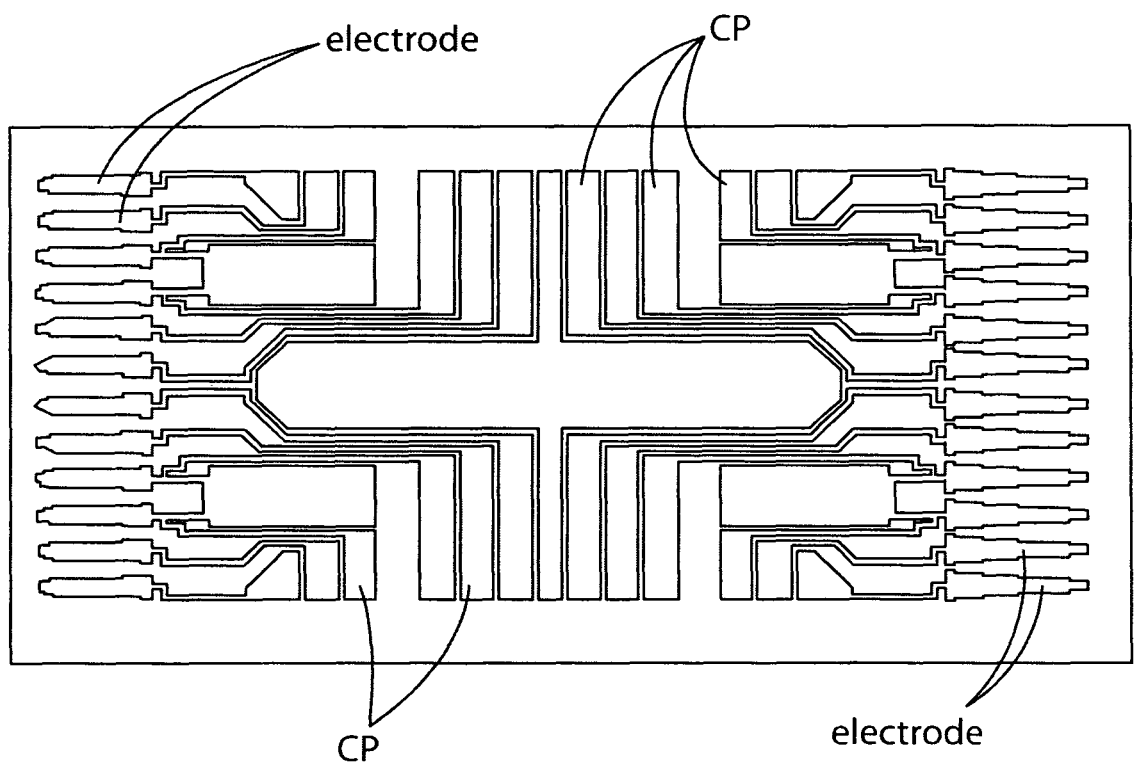
FIG. 8 is a plan view of a lower Pt electrode pattern.

The lower electrode is to be patterned to allow formation of contact pads CP. FIG. 8 shows one lower electrode lay-out to achieve this. Since the PZT layer has low adhesion on $SiO_2$ and $Si_3N_4$, the area covered by the above Ti/Pt layer is maximized including dummy structures. The PZT layer is deposited on top of the whole wafer, covering both the Pt areas and the spaces in between. The PZT deposition can be performed in different ways (sol-gel method or MOCVD) and is followed by a thermal curing adequate to the procedure selected.

On top of the PZT layer, the top electrode (not shown) is deposited and patterned. The top electrode can be a Pt layer patterned by lift off, or a Ti/Au layer or Cr/Au layer, that can be patterned by wet chemical etching or lift off. The same top Pt layer is used as an etching mask for the etching of the PZT. This can be a chemical etching (e.g. as described in E Hong, Mat. Res. Soc. Symp. Proc. Vol 687, 2002 B5.16.1, using BOE and HCl baths) or by RIE (e.g. $CHClF_2$). The platinum electrodes can be 50-100 nm thick and the Ti or Cr adhesion layer(s) can be 50-10 nm thick for purposes of illustration and not limitation. Adhesion layers, such as Ti layers or films, for Pt and Au electrodes are described in copending Ser. No. 10/801,928, now U.S. Pat. No. 7,250,139, incorporated herein by reference.

In the embodiments of invention for dispensing material, the material M may comprise a writing fluid such as an alkanethiol liquid solution (e.g. saturated solution of 1-octadecanethiol in acetonitrile) onto surface S, which may comprise gold, for purposes of illustration and not limitation to form a nanopattern. The alkanethiol molecules are transported by diffusion and capillary action from the one or more microtips 106 to the gold surface and have a chemical affinity for the gold surface to attach thereto by chemisorption to form a monolayer. However, the invention is not limited to any particular writing fluid (liquid) or other material to be dispensed from microtips 106. For example, for purposes of illustration and not limitation, the material may comprise any chemical molecule, biomolecule (e.g. DNA, protein, etc.), nanoparticles (e.g. Au or diamond) or other species. The molecule or species may or may not be in a liquid aqueous or organic solution or dispersed in a liquid carrier. Moreover, a solid material may be dispensed from the dispensing device 100 by surface diffusion or a combination of surface diffusion and capillary action intermediated or facilitated by a meniscus formed by capillary condensation between the tip 106 and the substrate of the moisture present in the ambient or adsorbed onto the substrate. For example, a writing material dispersed, dissolved or otherwise present in a fluid carrier is supplied from the reservoir through the microchannel to the microtip where the writing material may or may not solidify or transform to a solid or be present as a solid material sans the fluid carrier (e.g. the carrier fluid dries or is otherwise removed) at the microtip. Dispensing of the writing material from the microtip to the surface S can be facilitated by formation of a meniscus out of water present on the surface S and/or in the ambient environment or atmosphere. For purposes of illustration and not limitation, a material including, but not limited to, 1-octadecanethiol, may be dispensed from the microtips 106 by the combined diffusion/capillary condensation action mechanism.

The material, whether a fluid or a solid, can be deposited on surface S to form a pattern with nanometer resolution of pattern features, to initiate local reactions, to effect exchange of ions, and for other purposes.

Potential applications for the dispensing device 100 include, but are not limited to, DNA nanopatterning involving depositing DNA for sequencing and/or synthesis, protheomics, combinatorial nanochemistry, nanolithography involving dispensing photoresist or other resist materials, scanning probe microelectrochemistry involving imaging, etching, deposition, and nanovoltametry, scanning probe chemistry involving etching, deposition, and mask repair, and nanojets and atom guns involving localized delivery of free radicals and atom species.

Although the invention has been described in connection with certain embodiments thereof, those skilled in the art will appreciate that the modifications and changes can be made thereto without departing form the spirit and scope of the invention as set forth in the appended claims.

We claim:

1. A method of forming an elongated microchannel, comprising the steps of:
   forming a first thin film on a side of a substrate;
   forming a fugitive second thin film on the first thin film such that the second thin film defines a precursor of the elongated microchannel and a plurality of extensions connected to and extending transversely relative to the precursor along a length thereof;
   forming a third thin film on the first thin film and the fugitive second thin film such that the second thin film resides between the first thin film and the third thin film;
   forming a respective access site in a region of the third thin film residing on a respective extension and penetrating to the fugitive second thin film; and
   selectively removing the fugitive second thin film forming the precursor from between the first thin film and the third thin film using an etching medium introduced through the access sites, thereby forming a microchannel between the first thin film and the third thin film.

2. The method of claim 1 further including forming a sealing layer on the third thin film in a manner to close off open access sites remaining after selective removal of the second thin film.

3. The method of claim 2 wherein the first thin film is formed to define an elongated cantilever such that the microchannel extends along a length thereof.

4. The method of claim 3 further including forming a piezoelectric actuator layer on the cantilever.

5. The method of claim 4 wherein the actuator layer is formed on the sealing layer.

6. The method of claim 5 wherein the actuator layer is formed on the sealing layer and then the actuator layer and sealing layer are patterned to overlie the cantilever.

7. The method of claim 1 including leaving some of the fugitive second thin film at the extensions after selective removal of the precursor.

8. The method of claim 1 further including forming the first thin film, second thin film, and third thin film on a pointed microtip of the substrate, providing an access site in the third thin film at the microtip and selectively removing the fugitive second layer at the tip using an etching medium introduced through the access site to form an annular space disposed between the first thin film and the third thin film at the microtip and communicated to the microchannel.

9. The method of claim 8 wherein the first thin film comprises diamond.

10. The method of claim 8 wherein the first thin film comprises silicon carbide.

11. The method of claim 1 further including forming a reservoir on an opposite side of the substrate from the first thin film.

12. The method of claim 11 including forming one or more openings in the first thin film layer at a location such that the one or more openings communicate to the reservoir after its formation.

13. The method of claim 12 wherein the one or more openings communicate to another microchannel formed between the microchannel of the cantilever and the reservoir.

14. A method of making a cantilever on a substrate, comprising the steps of:
    forming a first thin film on a semiconductor chip substrate to define an elongated cantilever shape on the substrate;
    forming a fugitive second thin film on the first thin film such that the second thin film defines a precursor of an elongated microchannel and a plurality of extensions connected to and extending transversely relative to the precursor along a length thereof;
    forming a third thin film on the first thin film and the fugitive second thin film such that the fugitive second thin film resides between the first thin film and the third thin film;
    forming a respective access site in a region of the third thin film residing on a respective extension and penetrating to the fugitive second thin film;
    selectively removing the fugitive second thin film forming the precursor from between the first thin film and the third thin film using an etching medium introduced through the access sites to thereby form a microchannel between the first thin film and the third thin film; and
    releasing an end of the cantilever shape from the substrate.

* * * * *